United States Patent [19]

Osborn

[11] 4,455,167

[45] Jun. 19, 1984

[54] NICKEL-ZINC DUST-IRON-NICKEL POWDER PIGMENT SYSTEM

[75] Inventor: Donald H. Osborn, Suffern, N.Y.

[73] Assignee: MPD Technology Corporation, Wyckoff, N.J.

[21] Appl. No.: 510,595

[22] Filed: Jul. 5, 1983

[51] Int. Cl.³ .............................. B22F 1/10; B22F 1/02
[52] U.S. Cl. ....................................... 75/255; 106/290; 106/291; 106/307
[58] Field of Search ................... 75/255; 106/290, 291, 106/307

[56] References Cited

U.S. PATENT DOCUMENTS

| | | | |
|---|---|---|---|
| 2,159,231 | 5/1939 | Schlecht et al. | 75/255 |
| 2,365,356 | 12/1944 | Pilling et al. | 106/290 |
| 2,456,313 | 12/1948 | Pratt | 106/290 |
| 3,941,609 | 3/1976 | Stern | 106/290 |

*Primary Examiner*—Veronica O'Keefe
*Attorney, Agent, or Firm*—Francis J. Mulligan, Jr.; Raymond J. Kenny

[57] ABSTRACT

A pigment system for electronic and electromagnetic shielding coatings including in percent by weight about 30% to about 70% of a nickel powder produced by decomposition of nickel carbonyl under conditions to provide a powder having a chain-like structure of irregularly shaped particles with an average particle size in the range of about 2 to 4 micrometers (um) and a specific surface area of at least about 0.5 m²/g, about 20% to about 60% zinc dust and up to about 40% of an iron-nickel powder produced by codeposition from nickel and iron carbonyl with the proviso that the percentage of nickel powder plus the percentage of nickel-iron powder must be in excess of about 45%.

5 Claims, No Drawings

NICKEL-ZINC DUST-IRON-NICKEL POWDER PIGMENT SYSTEM

TECHNICAL FIELD

This invention relates to pigments and more particularly to a metallic pigment system of relatively low cost for use in organic coatings serving to provide electronic and magnetic shielding characteristics to non-metallic enclosures for electronic devices.

BACKGROUND ART

Metallic or metallic appearing pigments in organic vehicles have been used for many years in organic coatings serving various aesthetic and functional purposes. Relatively recently, metallic pigments have been used to provide electroconductive coatings for non-metallic electronic housings which coatings have radio frequency interference and electromagnetic interference shielding characteristics. The conductivity of the coatings is evaluated in tests for surface resistance. Surface resistance (or more technically, the resistivity) of a conductive paint is measured in ohms per square. Ohms per square is a non-dimensional measurement which is derived from ohms law and specific resistance equations, and as such is independent of the area of square-faced probes, provided the distance between the probes is equal to the size of the probes. The required level for surface resistance is 0.5 ohm per square or less. The conductive pigment is mixed in a carrier paint system, applied as a uniform layer to a glass microscope slide or a structural foam plastic substrate and dried. Surface resistance is determined by placing a set of flat square-faced probes, having equal surface areas, in contact with the surface of the dried conductive coating and recording the resistance with an ohmmeter. The distance between the probes is such that the surface area between the probes is equal to the area of each probe (e.g., probes 1" square would have exactly 1" between the edges of the probes). The surface resistance is independant of the area of the conductor, as long as the length and width are equal. The test is non-standard, but is comparative.

Provided that electroconductivity characteristics are satisfactory, the electromagnetic shielding characteristics of the coating material are essentially determined by the electromagnetic characteristics of the pigment. For electromagnetic shielding purposes, it is advantageous that the metallic pigment as a whole be a ferromagnetic material of reasonable magnetic saturation and low remanence. As a further point, metallic pigments suitable for electrical and electromagnetic shielding purposes should be as inexpensive as is practical.

It is the object of this invention to provide an inexpensive pigment material or system adapted to be employed in an organic vehicle, the coating material thus provided having, in the dried thin film state, good electrical conductivity and good electromagnetic shielding characteristics.

SUMMARY OF THE INVENTION

The present invention contemplates as a pigment system in percent by weight about 30% to about 70% of a nickel powder produced by decomposition of nickel carbonyl under conditions to provide a powder having a chain-like structure of irregularly shaped particles with an average particle size in the range of about 2 to 4 micrometers ($\mu$m) and a specific surface area of at least about 0.5 m$^2$/g, about 20% to about 60% zinc dust and up to about 40% of an iron-nickel powder produced by codeposition from nickel and iron carbonyl with the proviso that the percentage of nickel powder plus the percentage of nickel-iron powder must be in excess of about 45%.

The pigment system of the present invention is adapted to be included in coating materials having as vehicles any of the standard, normally employed coating resins including alkyd resins, acrylic resins, epoxy resins, elastomeric resins employed as solutions in essentially non-polar organic solvents or as dispersed systems in which water with or without additives is the continuous phase of the dispersion. When used with vehicles comprising resins dissolved in non-polar organic solvents, the pigment system of the present invention is essentially stable for indefinite periods of time, the stability of the pigment-vehicle combination except for normal settling, being a function of vehicle stability. When used with vehicles comprising resins dispersed in aqueous media, the pigment system of the present invention should be blended immediately or shortly before use. If longer times are contemplated for contact between the pigment system of the present invention and water-based or even alcohol-based vehicles, corrosion inhibitors e.g. chromates should be included in the vehicle.

Coatings inclusive of the pigment system of the present invention can, if desired, include in addition to resin, solvent (or dispersing medium) normal catalysts, driers, etc., additional pigments and toners which may vary the visual appearance of the coating or add to (or detract from) the basic electrical and electromagnetic characteristics of the pigment system of the invention. Thus as an example, a coating inclusive of the pigment system of the present invention can include as a secondary pigment carbon black, especially carbon black of the kind generally referred to as a conductive carbon black. While electrical conductivity of the resultant coating may be enhanced because of the presence of the additional pigment, the carbon black at times may increase the sensitivity of the coating to the effects of atmospheric moisture.

BEST MODES FOR CARRYING OUT THE INVENTION

In formulating pigment systems of the present invention it is advantageous to employ as the nickel powder either powder type 255 or powder type 287 marketed in the United States of America by The International Nickel Company, Inc. of Sterling Forest, Suffern, N.Y. The typical physical characteristics and chemical analyses (in weight percent) of these two types of nickel powder produced by decomposition of nickel carbonyl are set forth in Table I.

TABLE I

| Characteristic | Type 255 | Type 287 |
| --- | --- | --- |
| Average Particle Size (Fisher Sub-Sieve Sizer) | 2.2 to 2.8 $\mu$m | 2.6–3.3 $\mu$m |
| Apparent Density | 0.5–0.65 g/cc | 0.75–0.95 g/cc |
| Specific Surface Area | 0.68 m$^2$/g | 0.58 m$^2$/g |
| Carbon | <0.25 | <0.25 |
| Sulfur | <0.001 | <0.001 |
| Iron | <0.01 | <0.01 |
| Oxygen | <0.15 | <0.15 |

TABLE I-continued

| Characteristic | Type 255 | Type 287 |
| --- | --- | --- |
| Nickel | Balance | Balance |

Zinc dust is a product commercially available from numerous sources which conforms to the ASTM Standard D520-51 reapproved in 1976. According to this standard, zinc dust is of two types which must conform in the compositional requirements set forth in Table II.

TABLE II

| | Type I | Type II |
| --- | --- | --- |
| Total zinc, calculated as Zn, min, percent | 97.5 | 98.0 |
| Metallic zinc, min, percent | 94.0 | 94.0 |
| Material other than metallic zinc and ZnO, max, percent | 1.5 | — |
| Calcium calculated as CaO, max, percent | 0.7 | 0.7 |
| Lead, calculated as Pb, max, percent | — | 0.01 |
| Iron, calculated as Fe, max, percent | — | 0.02 |
| Cadmium, calculated as Cd, max, percent | — | 0.01 |
| Chlorine, calculated as Cl max, percent | — | 0.01 |
| Sulfur, calculated as $So_2$, max, percent | — | 0.01 |
| Moisture and other volatile matter, max, percent | 0.1 | 0.10 |
| Oily or fatty matter, or both, max, percent | — | 0.05 |
| Zinc oxide (ZnO), max percent | 6.0 | remainder |
| Coarse particles, max, percent: Total residue retained on a No. 100 (150-μm) sieve | none | 0.1 |
| Total residue retained on a No. 200 (75-μm) sieve | — | 0.8 |
| Total residue retained on a No. 325 (45-μm) sieve | 4.0 | 3.0 |

Either type of zinc dust can be employed in the pigment system of the present invention. However, Type I with fewer very coarse particles is preferred. Codecomposed nickel-iron powder is material of fine particle size normally having a nickel content of about 15% by weight and is a product of INCO LIMITED, a corporation of Canada. On occasion, this product can contain nickel in amounts as high as up to about 30% by weight. For purposes of the present invention, the alloy powder containing lower amounts of nickel is perfectly satisfactory.

In order to provide to the art a teaching of the exact best modes of the invention contemplated by the applicant and to indicate the composition of other pigments and pigment systems tested by the applicant, a number of compositions in terms of percent by weight are set forth in Table III. With respect to the compositions set forth in Table III, those designated by numbers are within the ambit of the present invention and those designated by letters are outside the ambit of the present invention.

TABLE III

| COMPO-SITION | Ni (Type 287) | Ni (Type 255) | Fe/Ni | Zn Dust | Other |
| --- | --- | --- | --- | --- | --- |
| A | 100 | — | — | — | — |
| B | 70 | — | 30 | — | — |
| C | 25 | 25 | 25 | — | 25 Cu |
| 1 | — | 50 | — | 50 | — |
| 2 | — | 45 | 30 | 25 | — |
| 3 | — | 70 | — | 30 | — |
| D | — | 30 | — | 7 | — |

The pigment systems set forth in Table III were blended by simple dry mixing of the dry component powdered metals under mild conditions such as exist in a normal double cone blender. In mixing such dry metallic powders, normal care should be taken to avoid hazardous conditions, such normal care being essentially the same as procedures employed in conventional powder metallurgical operations. Vigorous mixing techniques which would break down the filamentary nature of the nickel powder are not necessary and should be avoided. Again, when incorporating pigment systems of the present invention into prepared vehicles, vigorous mixing conditions should be avoided where possible.

The pigment and pigment systems set forth in Table III were blended into a conventional acrylic coating medium in various ratios of pigment to binder (ratio by weight) as set forth in Table IV and tested for surface resistance as explained hereinbefore in the as produced (coated and cured) condition after steam exposure at 100° C. for 1 hour and after heat aged. The results of such tests are also set forth in Table IV.

TABLE IV

| | | SURFACE RESISTANCE/sq. cm | | |
| --- | --- | --- | --- | --- |
| Composition | Pig./Binder | As Prepared | After Steam Exposure | After Heat Age |
| A | 1/1.33 | 0.2 | 0.3 | 0.3 |
| B | 1/1.33 | 0.2 | 0.65 | 0.5 |
| C | 1/1.33 | 0.5 | 1.4 | 1.4 |
| 1 | 1/1.33 | 0.2 | 0.2 | 0.2. |
| 2 | 1.24/1.33 | 0.4 | 0.4 | 0.4 |
| 2 | 1/1.33 | 0.7 | 0.7 | |
| 3 | 1/1.33 | 0.2 | 0.1 | |
| 3 | 0.84/1.33 | 0.4 | 0.4 | |
| D | 1.57/1.33 | 0.4 | 0.4 | |
| | 1/1.33 | 2.6 | 2.6 | |

The data in Table IV shows that composition A which is pure nickel and thus very expensive gives very acceptable results. Of equal merit is composition 1 which contains only 50% of the expensive nickel. Composition B shows the effect of substituting 30% of codecomposed nickel-iron powder for an equal weight of nickel in composition A. The test results as to this composition are marginal in commercial acceptability after accelerated environmental exposure. Composition C containing copper fails to provide the expected good conductivity in the as-prepared condition and is totally unacceptable after environmental exposure. Composition D exhibits in one instance reasonable surface resistivity but only at unreasonably high pigment loading. Composition 2, within the invention, shows acceptable test results at a moderately high pigment loading but borderline acceptability at more normal pigment loading. It is significant that the zinc content of composition 2 prevents the increase in surface resistance after environmental testing shown by the zinc-free composition B. Composition 3 exhibits very acceptable surface resistance both as prepared and after environmental exposure even at low pigment loadings and, in comparison to the results of composition, indicates that in terms of surface resistance it is advantageous for pigment systems of the present invention to contain at least about 50% nickel powder of the structure of type 287 or 255.

It is to be noted that although the pigment system of the present invention has been described in conjunction with coatings, it is also applicable for incorporation into compositions, particularly resin compositions used forr moldings, sheet and film applications. It is cautioned that incorporation into such resin systems should be done in the least energetic manner possible to avoid destruction of the nickel powder filamentary structure.

The embodiments of the invention in which an exclusive property or privilige is claimed are defined as follows:

1. A pigment system for electronic and electromagnetic shielding coatings including in percent by weight about 30% to about 70% of a nickel powder produced by decomposition of nickel carbonyl under conditions to provide a powder having a chain-like structure of irregularly shaped particles with an average particle size in the range of about 2 to 4 micrometers ($\mu$m) and a specific surface area of at least about 0.5 m$^2$/g, about 20% to about 60% zinc dust and up to about 40% of an iron-nickel powder produced by codeposition from nickel and iron carbonyl with the proviso that the percentage of nickel powder plus the percentage of nickel-iron powder must be in excess of about 45%.

2. A pigment system as in claim 1 which contains at least about 50% by weight of nickel powder.

3. A pigment system as in claim 1 dispersed in an organic vehicle.

4. A dispersed pigment system as in claim 3 containing auxiliary pigments.

5. A pigment system as in claim 1 dispersed in an organic resin.

* * * * *